United States Patent
Shen et al.

(10) Patent No.: US 11,081,402 B2
(45) Date of Patent: Aug. 3, 2021

(54) REPLACEMENT GATE PROCESS FOR SEMICONDUCTOR DEVICES

(71) Applicant: Taiwan Semiconductor Manufacturing Company, Ltd., Hsin-Chu (TW)

(72) Inventors: Yu-Jen Shen, Hsin-Chu (TW); Ying-Ho Chen, Taipei (TW); Yung-Cheng Lu, Hsinchu (TW)

(73) Assignee: TAIWAN SEMICONDUCTOR MANUFACTURING COMPANY, LTD., Hsin-Chu (TW)

(*) Notice: Subject to any disclaimer, the term of this patent is extended or adjusted under 35 U.S.C. 154(b) by 0 days.

(21) Appl. No.: 16/717,542

(22) Filed: Dec. 17, 2019

(65) Prior Publication Data

US 2020/0118887 A1 Apr. 16, 2020

Related U.S. Application Data

(63) Continuation of application No. 15/915,272, filed on Mar. 8, 2018, now Pat. No. 10,515,860, which is a (Continued)

(51) Int. Cl.
*H01L 21/8238* (2006.01)
*H01L 21/8234* (2006.01)
(Continued)

(52) U.S. Cl.
CPC .. *H01L 21/823828* (2013.01); *H01L 21/0217* (2013.01); *H01L 21/02164* (2013.01);
(Continued)

(58) Field of Classification Search
None
See application file for complete search history.

(56) References Cited

U.S. PATENT DOCUMENTS 5,505,816 A 4/1996 Barnes et al.
6,692,903 B2 2/2004 Chen et al.
(Continued)

FOREIGN PATENT DOCUMENTS

KR 10-0801744 2/2008

OTHER PUBLICATIONS

Office Action dated Dec. 2, 2015, issued by the Korean Patent Office in Korean Patent Application No. 10-2014-0177640, 10 pages.

*Primary Examiner* — Jiong-Ping Lu
(74) *Attorney, Agent, or Firm* — Haynes and Boone, LLP

(57) ABSTRACT

Disclosed is a method of forming a semiconductor device. The method includes providing a precursor having a substrate and gate stacks over the substrate, wherein each of the gate stacks includes an electrode layer, a first hard mask (HM) layer over the electrode layer, and a second HM layer over the first HM layer. The method further includes depositing a dielectric layer over the substrate and the gate stacks and filling spaces between the gate stacks; and performing a first chemical mechanical planarization (CMP) process to partially remove the dielectric layer. The method further includes performing an etching process to remove the second HM layer and to partially remove the dielectric layer, thereby exposing the first HM layer. The method further includes performing a second CMP process to at least partially remove the first HM layer.

20 Claims, 13 Drawing Sheets

Related U.S. Application Data continuation of application No. 15/236,210, filed on Aug. 12, 2016, now Pat. No. 9,917,017.

(60) Provisional application No. 62/272,272, filed on Dec. 29, 2015.

(51) Int. Cl.

| | | |
|---|---|---|
| H01L 29/66 | (2006.01) | |
| H01L 21/3065 | (2006.01) | |
| H01L 21/768 | (2006.01) | |
| H01L 21/321 | (2006.01) | |
| H01L 21/02 | (2006.01) | |
| H01L 21/3105 | (2006.01) | |
| H01L 21/311 | (2006.01) | |
| H01L 21/66 | (2006.01) | |

(52) U.S. Cl.
CPC .... *H01L 21/3065* (2013.01); *H01L 21/31053* (2013.01); *H01L 21/31116* (2013.01); *H01L 21/3212* (2013.01); *H01L 21/76837* (2013.01); *H01L 21/823437* (2013.01); *H01L 21/823456* (2013.01); *H01L 29/66545* (2013.01); *H01L 22/26* (2013.01)

(56) References Cited

U.S. PATENT DOCUMENTS

| | | |
|---|---|---|
| 6,864,164 B1 | 3/2005 | Dakshina-Murthy et al. |
| 7,732,346 B2 | 6/2010 | Hsu et al. |
| 8,048,733 B2 | 11/2011 | Yeh et al. |
| 8,252,194 B2 | 8/2012 | Kiehlbauch et al. |
| 8,318,568 B2 | 11/2012 | Doris et al. |
| 8,350,335 B2 | 1/2013 | Kikuchi |
| 8,361,855 B2 | 1/2013 | Yeh et al. |
| 8,410,548 B2 | 4/2013 | Parthasarathy et al. |
| 8,415,254 B2 | 4/2013 | Angadi |
| 8,466,502 B2 | 6/2013 | Tsai et al. |
| 8,487,378 B2 | 7/2013 | Goto et al. |
| 8,551,843 B1 | 10/2013 | Cai et al. |
| 8,586,436 B2 | 11/2013 | Ng et al. |
| 8,729,634 B2 | 5/2014 | Shen et al. |
| 8,815,741 B1 | 8/2014 | Richter et al. |
| 8,826,213 B1 | 9/2014 | Ho et al. |
| 8,887,106 B2 | 11/2014 | Ho et al. |
| 8,889,022 B2 | 11/2014 | Moll et al. |
| 8,943,455 B2 | 1/2015 | Chen et al. |
| 9,111,795 B2 | 8/2015 | Ieda et al. |
| 9,917,017 B2* | 3/2018 | Shen ................ H01L 21/02164 |
| 10,515,860 B2* | 12/2019 | Shen ................ H01L 21/31053 |
| 2005/0148130 A1 | 7/2005 | Doczy et al. |
| 2006/0183055 A1 | 8/2006 | O'Neill et al. |
| 2006/0196527 A1 | 9/2006 | Nishimura et al. |
| 2010/0048007 A1* | 2/2010 | Lee ..................... H01L 21/3212 438/585 |
| 2010/0311231 A1 | 12/2010 | Thei et al. |
| 2012/0045880 A1* | 2/2012 | Ma ....................... H01L 29/4966 438/287 |
| 2013/0200461 A1 | 8/2013 | Liu et al. |
| 2013/0320455 A1 | 12/2013 | Cappellani et al. |
| 2016/0163830 A1 | 6/2016 | Yu et al. |
| 2017/0186650 A1 | 6/2017 | Shen et al. |
| 2018/0197795 A1 | 7/2018 | Shen et al. |

* cited by examiner

REPLACEMENT GATE PROCESS FOR SEMICONDUCTOR DEVICES

PRIORITY

The present application is a continuation of U.S. patent application Ser. No. 15/915,272, filed Mar. 8, 2018, now U.S. Pat. No. 10,515,860, which is a continuation of U.S. patent application Ser. No. 15/236,210, filed Aug. 12, 2016, now U.S. Pat. No. 9,917,017, which claims the benefit of U.S. Prov. App. Ser. No. 62/272,272, filed Dec. 29, 2015, titled "Replacement Gate Process for Semiconductor Devices," each of which is herein incorporated by reference in its entirety.

BACKGROUND

The semiconductor integrated circuit (IC) industry has experienced exponential growth. Technological advances in IC materials and design have produced generations of ICs where each generation has smaller and more complex circuits than the previous generation. In the course of IC evolution, functional density (i.e., the number of interconnected devices per chip area) has generally increased while geometry size (i.e., the smallest component (or line) that can be created using a fabrication process) has decreased. This scaling down process generally provides benefits by increasing production efficiency and lowering associated costs. Such scaling down has also increased the complexity of processing and manufacturing ICs and, for these advancements to be realized, similar developments in IC processing and manufacturing are needed.

One advancement implemented in some IC designs has been the replacement of the typically polysilicon gate electrode with a metal gate electrode to improve device performance with the decreased feature sizes. One process of forming a metal gate electrode is termed a replacement-gate or "gate-last" process in which the metal gate electrode is fabricated "last," by replacing a polysilicon gate. This allows for reduced number of subsequent processes, including high temperature processing, that is performed after the formation of the final gate. However, there are challenges to implementing such IC fabrication processes, especially with scaled down IC features in advanced process nodes, such as 20 nanometer (nm), 16 nm, and beyond. For example, different areas of an IC may have different gate lengths and/or undergo different fabrication steps between the formation of the gates and the replacement of the gates with metal gates. It is challenging to maintain a uniform height among the polysilicon gates in different areas of an IC. The variations in the polysilicon gates' heights present issues for subsequent replacement gate processes.

BRIEF DESCRIPTION OF THE DRAWINGS

The present disclosure is best understood from the following detailed description when read with the accompanying figures. It is emphasized that, in accordance with the standard practice in the industry, various features are not drawn to scale and are used for illustration purposes only. In fact, the dimensions of the various features may be arbitrarily increased or reduced for clarity of discussion.

DETAILED DESCRIPTION

Figure 1:
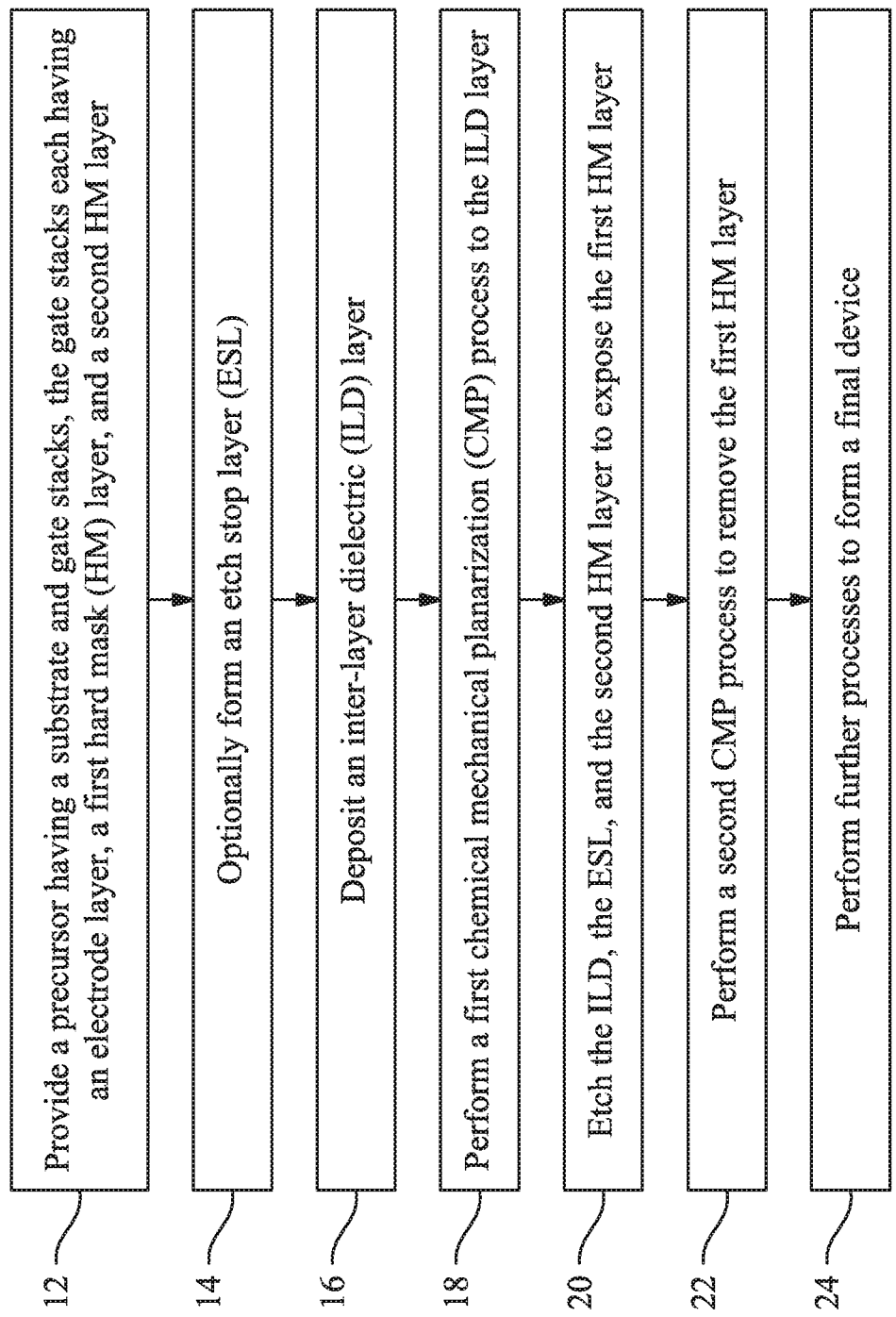
FIG. 1 is a flow chart of a method of forming a semiconductor device, according to various aspects of the present disclosure.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Referring to FIG. 1, shown therein is a method 10 of forming a semiconductor device according to various aspects of the present disclosure. As will be discussed below, the device will undergo a replacement-gate process where typical polysilicon gates are replaced with final (metal) gates. One goal of some embodiments of the method 10 is to provide the gates with a near uniform height right before they are replaced, thereby eliminating or reducing issues commonly seen with typical "gate-last" processes, such as within-die gate height loading issues, dielectric residue issues, and incomplete poly-cut issues. The method 10 is an example, and is not intended to limit the present disclosure beyond what is explicitly recited in the claims. Additional operations can be provided before, during, and after the method 10, and some operations described can be replaced, eliminated, or moved around for additional embodiments of the method. The method 10 is described below in conjunction with FIGS. 4-14 which are cross-sectional views and top views of a device 100 according to various aspects of the present disclosure.

As will be shown, the device 100 may be an intermediate device fabricated during processing of an IC, or a portion thereof, that may comprise static random access memory (SRAM) and/or other logic circuits, passive components such as resistors, capacitors, and inductors, and active components such as p-type field effect transistors (PFET), n-type FET (NFET), metal-oxide semiconductor field effect transistors (MOSFET), complementary metal-oxide semiconductor (CMOS) transistors, bipolar transistors, high voltage transistors, high frequency transistors, other memory cells, and combinations thereof. Further, the transistors may be multi-gate transistors, such as FinFETs.

Figure 4:
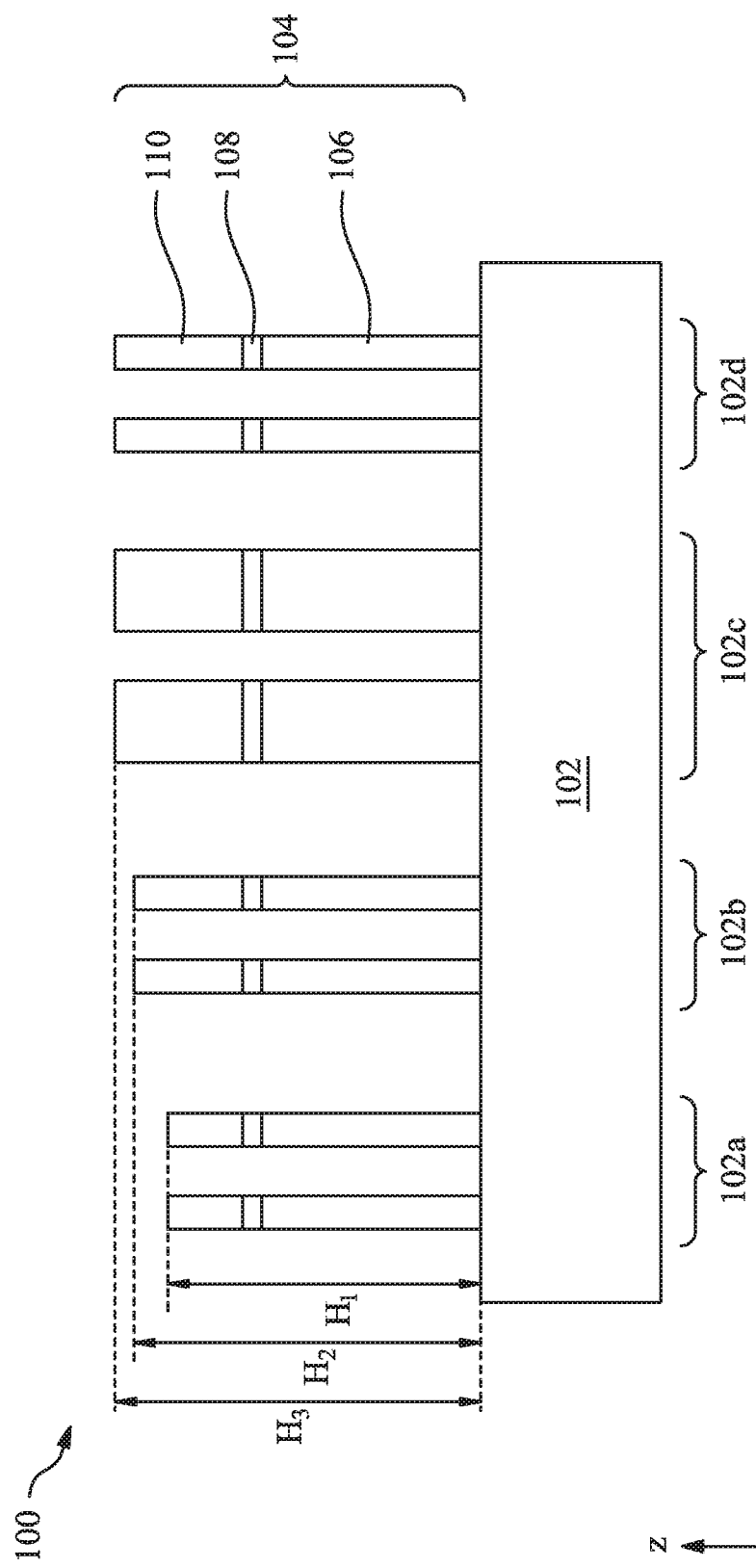
FIGS. 4, 5, 6, 7, 8, 9, 10, 13, and 14 illustrate cross-sectional views of forming a target semiconductor device according to the method of FIG. 1, in accordance with an embodiment.

At operation 12, the method 10 (FIG. 1) provides a precursor of the device 100. For the convenience of discussion, the precursor is also referred to as the device 100. Referring to FIG. 4, the device 100 includes a substrate 102 and gate stacks 104 disposed over the substrate 102. The substrate 102 is a silicon substrate in the present embodiment. Alternatively, the substrate 102 may comprise another elementary semiconductor, such as germanium; a compound semiconductor including silicon carbide, gallium arsenic, gallium phosphide, indium phosphide, indium arsenide, and/or indium antimonide; an alloy semiconductor including SiGe, GaAsP, AlInAs, AlGaAs, GaInAs, GaInP, and/or GaInAsP; or combinations thereof. In yet another alternative, the substrate 102 is a semiconductor on insulator (SOI). Even though not shown, the substrate 102 may include active regions separated by isolation features. For example, the active regions may be n-type doped active regions and/or p-type doped active regions, and may be planar active regions and/or non-planar active regions (e.g., fins). The isolation features may be shallow trench isolation (STI) features, field oxide, LOCal Oxidation of Silicon (LOCOS), and/or other suitable structures. Furthermore, the substrate 102 may include epitaxial features.

In the embodiment shown, each of the gate stacks 104 includes an electrode layer 106, a first hard mask (HM) layer 108 over the electrode layer 106, and a second HM layer 110 over the first HM layer 108. In an embodiment, the electrode layer 106 includes polysilicon. The electrode layer 106 may be formed by suitable deposition processes such as low-pressure chemical vapor deposition (LPCVD) and plasma-enhanced CVD (PECVD). In an embodiment, the first HM layer 108 includes a dielectric material comprising a nitride, such as silicon nitride or silicon oxynitride; and the second HM layer 110 includes a dielectric material comprising an oxide, such as silicon oxide. For example, a silicon nitride HM layer 108 may be formed by CVD using chemicals including Hexachlorodisilane (HCD or Si2C16), Dichlorosilane (DCS or SiH2C12), Bis(TertiaryButylAmino) Silane (BTBAS or C8H22N2Si) and Disilane (DS or Si2H6). For example, a silicon oxide HM layer 110 may be formed by thermal oxidation. In various embodiments, the first HM layer 108 and the second HM layer 110 comprise different dielectric materials. Each of the first and second HM layers, 108 and 110, may be formed by a suitable deposition method such as chemical oxidation, thermal oxidation, atomic layer deposition (ALD), chemical vapor deposition (CVD), and/or other suitable methods. The gate stacks 104 may include other layer(s). For example, the gate stacks 104 may include an interfacial layer between the electrode layer 106 and the substrate 102.

In embodiments, the various layers of the gate stacks 104 may be first deposited as blanket target layers over the substrate 102, and then patterned using a process that includes one or more photolithography processes and one or more etching processes. A typical photolithography process includes coating a resist layer over the target layers, soft baking the resist layer, and exposing the resist layer to a radiation using a mask (or photomask). The photolithography process further includes post-exposure baking, developing, and hard baking thereby removing portions of the resist layer and leaving a patterned resist layer as the masking element. The masking element provides various opening through which the target layers are etched using a dry etching, a wet etching, or other suitable etching methods. For example, a dry etching process may implement an oxygen-containing gas, a fluorine-containing gas (e.g., $CF_4$, $SF_6$, $CH_2F_2$, $CHF_3$, and/or $C_2F_6$), a chlorine-containing gas (e.g., $Cl_2$, $CHCl_3$, $CCl_4$, and/or $BCl_3$), a bromine-containing gas (e.g., HBr and/or $CHBR_3$), an iodine-containing gas, other suitable gases and/or plasmas, and/or combinations thereof. For example, a wet etching process may comprise etching in diluted hydrofluoric acid (DHF); potassium hydroxide (KOH) solution; ammonia; a solution containing hydrofluoric acid (HF), nitric acid ($HNO_3$), and/or acetic acid ($CH_3COOH$); or other suitable wet etchant. In an embodiment, a patterned resist is used as a masking element for etching the first and second HM layers, 110 and 108. Subsequently, the first and second HM layers, 110 and 108, are used as a masking element for etching the electrode layer 106. The one or more etching processes remove portions of the target layers, resulting in the gate stacks 104 standing over the substrate 102.

Although not shown, the device 100 may further include gate spacers on sidewalls of the gate stacks 104. For example, the gate spacers may include a dielectric material, such as silicon oxide, silicon nitride, or silicon oxynitride, and may be formed by one or more deposition and etch-back techniques.

The gate stacks 104 may be formed in different areas or regions of the substrate 102. In the embodiment shown, the gate stacks 104 are formed in substrate regions 102a, 102b, 102c, and 102d. The number of substrate regions and the number of gate stacks in each region as shown in FIGS. 4-14 are for simplification and ease of understanding and do not necessarily limit the embodiments to any types of devices, any number of devices, any number of regions, or any configuration of structures or regions. The different substrate regions 102a-d may be used for forming different types of devices, such as SRAM devices and logic devices. The gate stacks 104 in different substrate regions may have different pattern pitches and/or different pattern widths along the "x" direction. For example as shown in FIG. 4, the gate stacks 104 in the substrate region 102b have a narrower pattern width and a smaller pattern pitch than those in the substrate region 102c. In an embodiment, the substrate region 102b is for forming SRAM cells, while the substrate region 102c is for forming input/output (IO) cells.

Still referring to FIG. 4, in some embodiments, the gate stacks 104 may have different heights along the "z" direction. Particularly, the height (or thickness) of the HM layer 110 may vary among the substrate regions. For example, the gate stacks 104 in the substrate region 102a has a height $H_1$ that is less than a height $H_2$ of the gate stacks 104 in the substrate region 102b, which in turn is less than a height $H_3$ of the gate stacks 104 in the substrate region 102c. Again, the heights $H_1$, $H_2$, and $H_3$ in FIG. 4 are for illustrative purposes. The differences in the gate heights may result from a variety of factors. For example, when the HM layers 110 and 108 are used as a masking element for etching the electrode layer 106, etchants may be distributed unevenly across the surface of the device 100 due to variations in pattern densities, pattern widths, and/or pattern pitches. As a result, the HM layer 110 may be consumed relatively more in some regions (e.g., region 102a) and relatively less in some other regions (e.g., region 102d). For another example, some substrate regions may undergo more fabrication processes than other substrate regions after the gate stacks 104 have been formed. For example, some substrate regions may undergo epitaxial growth processes in the source/drain regions thereof and the epitaxial growth processes may be for n-type epitaxy or for p-type epitaxy. The HM layer 110 may be consumed unevenly in these additional fabrication processes.

In a replacement-gate process, the HM layers 110 and 108 need to be removed in order to expose the electrode layer 106 for replacement. However, the different gate heights present a challenge for typical replacement-gate processes. For example, in a typical replacement-gate process, the electrode layer 106 may be overly etched in the substrate region 102a, and/or the HM layer 108 may be incompletely etched in the substrate region 102d, leaving dielectric residues over the top of the electrode layer 106. Both the over-etching of the electrode layer 106 and the under-etching of the HM layer 108 are problematic for subsequent replacement processes. An object of the present disclosure is to completely remove the HM layers 110 and 108 and to provide the electrode layer 106 with a uniform height for the ease of subsequent replacement processes.

Figure 5:
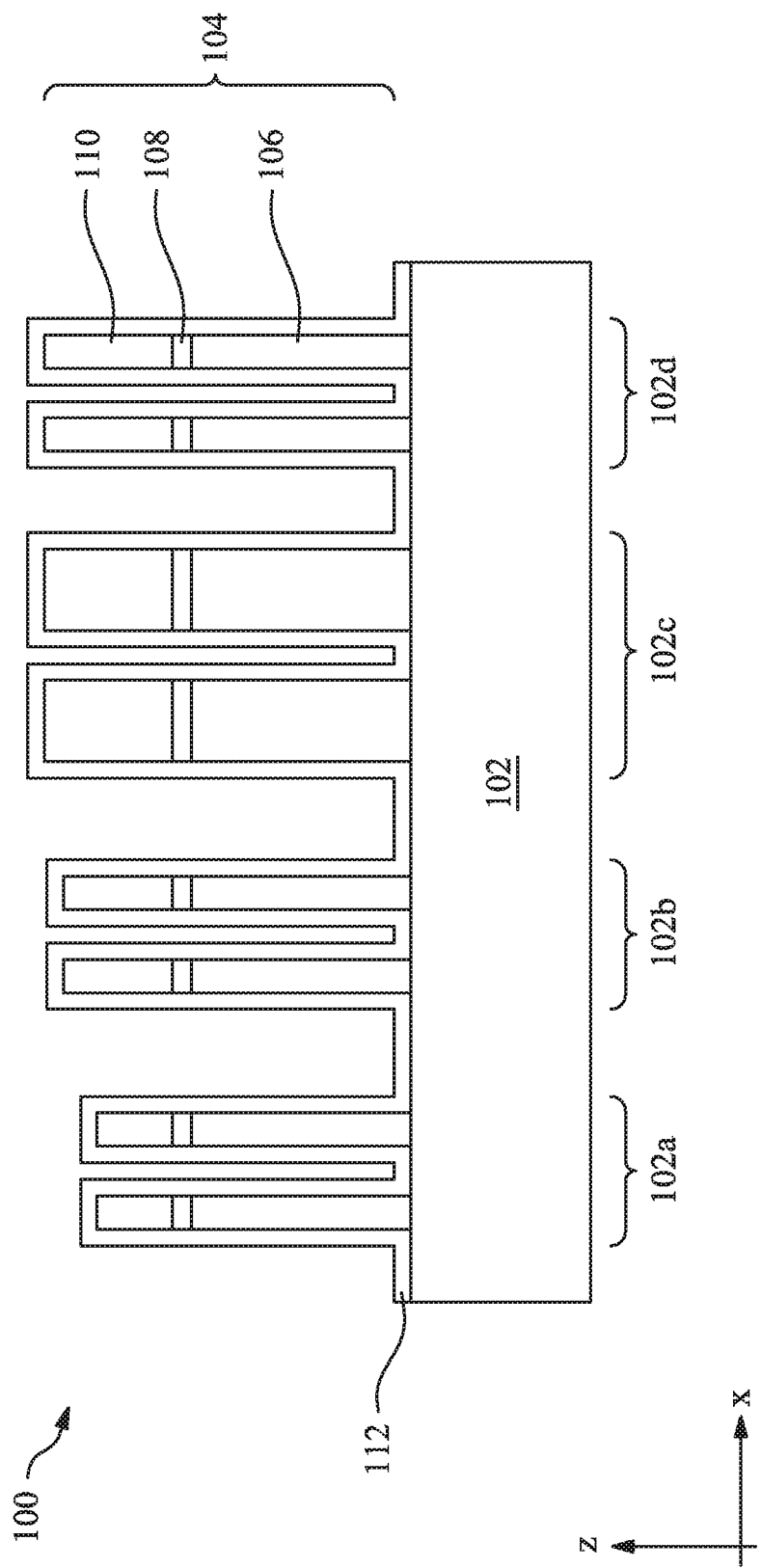

Referring to FIG. 1, at operation 14, the method 10 forms an etch stop layer (ESL) 112 over the substrate 102 and the gate stacks 104. Referring to FIG. 5, the ESL 112 is formed over top and sidewall surfaces of the gate stacks 104 and the top surface of the substrate 102. In an embodiment, the ESL 112 is formed to have a conformal cross-sectional profile (in the "x-z" plane). In an alternative embodiment, the ESL 112 does not have a conformal cross-sectional profile. In an embodiment, the ESL 112 comprises a nitride that may be the same as or different from the nitride of the first HM layer 108. The ESL 112 may be formed by CVD, PECVD, ALD, or other suitable deposition techniques. The ESL 112 is optional in some embodiments, i.e., the method 10 may skip operation 14 and proceeds from operation 12 to operation 16.

Figure 6:
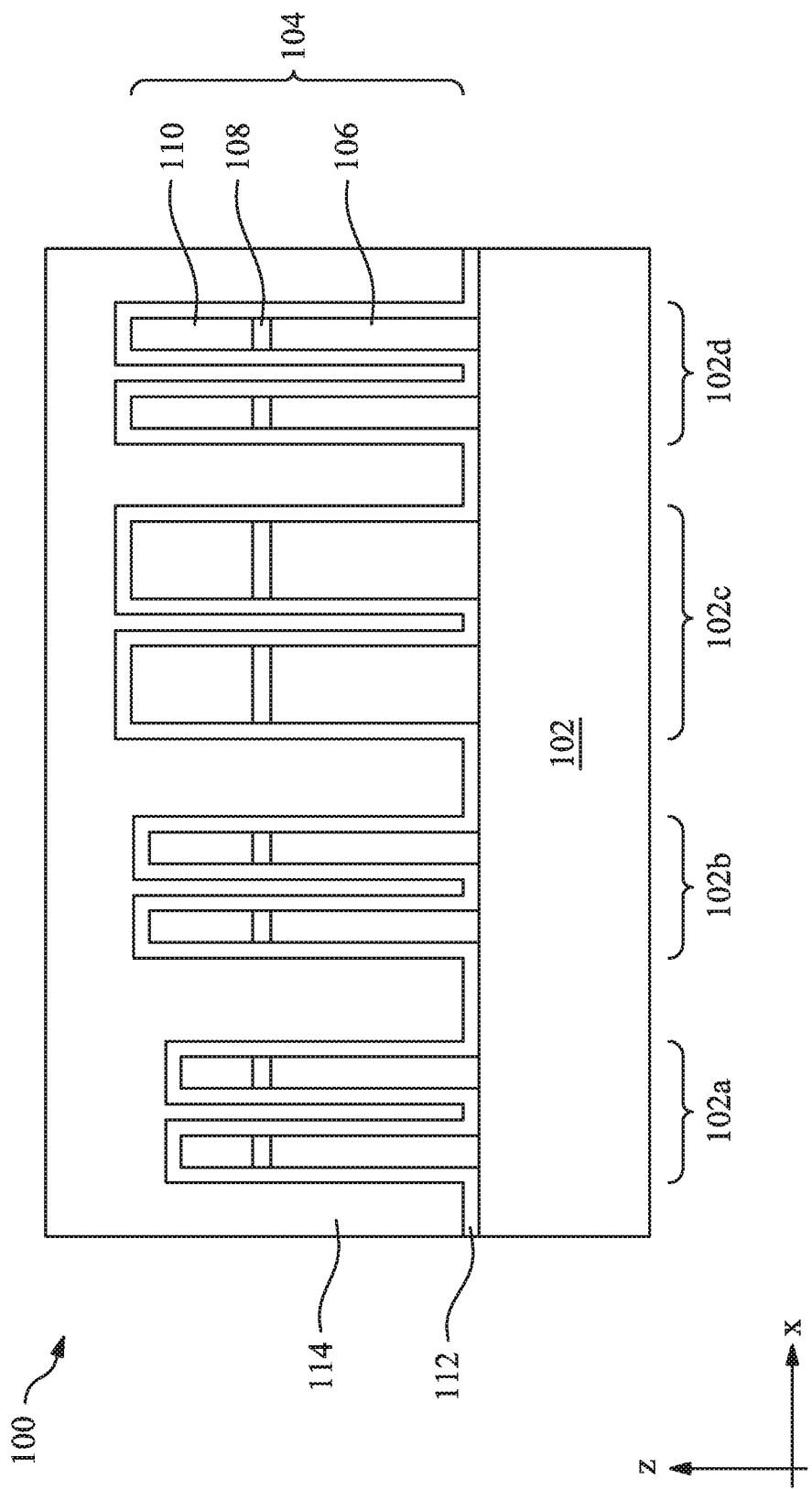

At operation 16, the method 10 (FIG. 1) deposits an inter-layer dielectric (ILD) layer 114 over the substrate 102, the gate stacks 104, and the ESL 112. Referring to FIG. 6, the ILD layer 114 covers the various structures including the gate stacks 104 and the ESL 112, and fills the spaces between the various structures over the substrate 102. In an embodiment, the ILD layer 114 includes an oxide such as tetraethylorthosilicate oxide, un-doped silicate glass, doped silicon oxide such as borophosphosilicate glass, fused silica glass, phosphosilicate glass, boron doped silicon glass, or other suitable oxide materials. The ILD layer 114 may be deposited by a PECVD process, a flowable CVD (FCVD) process, or other suitable deposition technique. For example, the FCVD process may include depositing a flowable material (such as a liquid compound) on the substrate 102 to fill the spaces between the various structures and converting the flowable material to a solid material by a suitable technique, such as annealing. The ILD layer 114 may or may not have a flat top surface as deposited.

Figure 7:
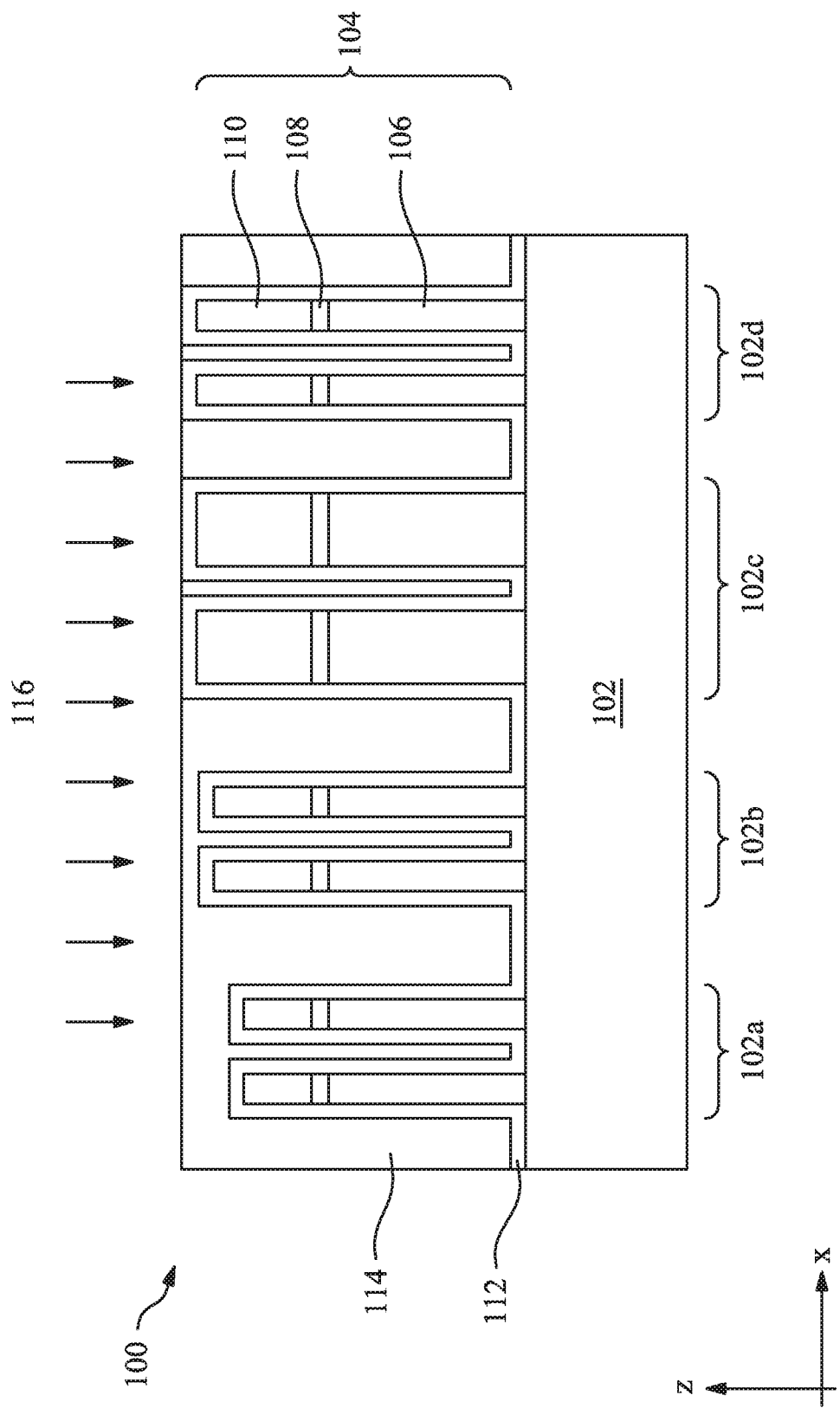

At operation 18, the method 10 (FIG. 1) performs a first chemical mechanical planarization (CMP) process 116 to partially remove the ILD layer 114. Referring to FIG. 7, in the present embodiment, the CMP process 116 partially removes the ILD layer 114 until a top surface of the ESL 112 is exposed, thereby planarizing a top surface of the device 100. In an embodiment, the ESL 112 is used as an end point for the CMP process 116. For embodiments where the ESL 112 is not included in the device 100, the second HM layer 110 may be used as an end point for the CMP process 116. For example, the CMP process 116 may apply CMP slurry over the ILD layer 114 and then grind and buff the device 100 until the end point (the ESL 112) is detected in situ. In some embodiments, the CMP slurry may be suspended in a mild etchant, such as potassium or ammonium hydroxide. The CMP slurry may include ferric nitrate, peroxide, potassium iodate, ammonia, silica, alumina, and/or other slurry materials as applicable. In some embodiments, the CMP slurry also includes organic additives configured to provide a better topography after the CMP process 116.

At operation 20, the method 10 (FIG. 1) etches the ILD layer 114, the ESL 112, and the second HM layer 110 to expose the first HM layer 108. In an embodiment, operation 20 includes a first etching 118 (operation 26) followed by a second etching 120 (operation 28), as illustrated in FIGS. 2, 8, and 9.

Figure 2:
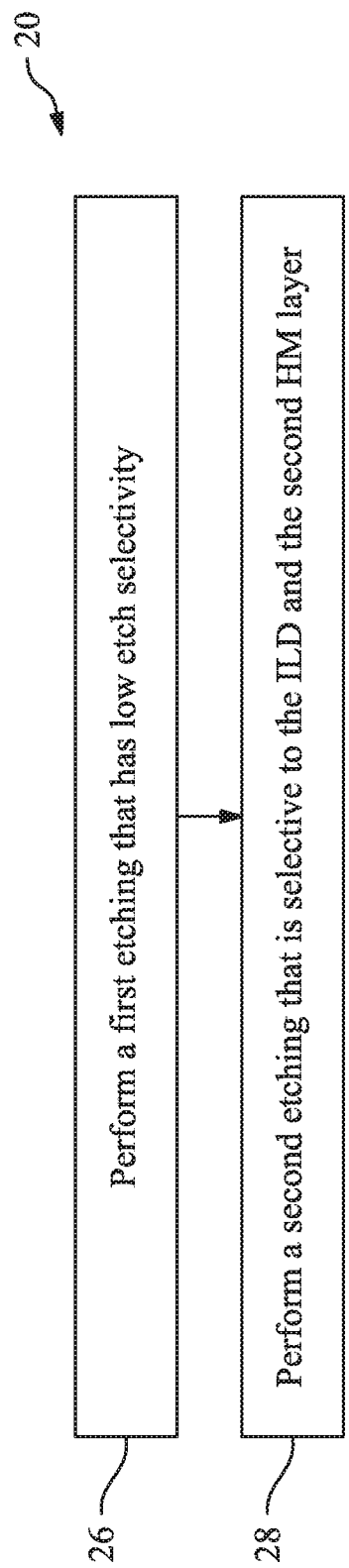
FIGS. 2 and 3 are embodiments of some steps of the method in FIG. 1, in accordance with some embodiments.
Figure 8:
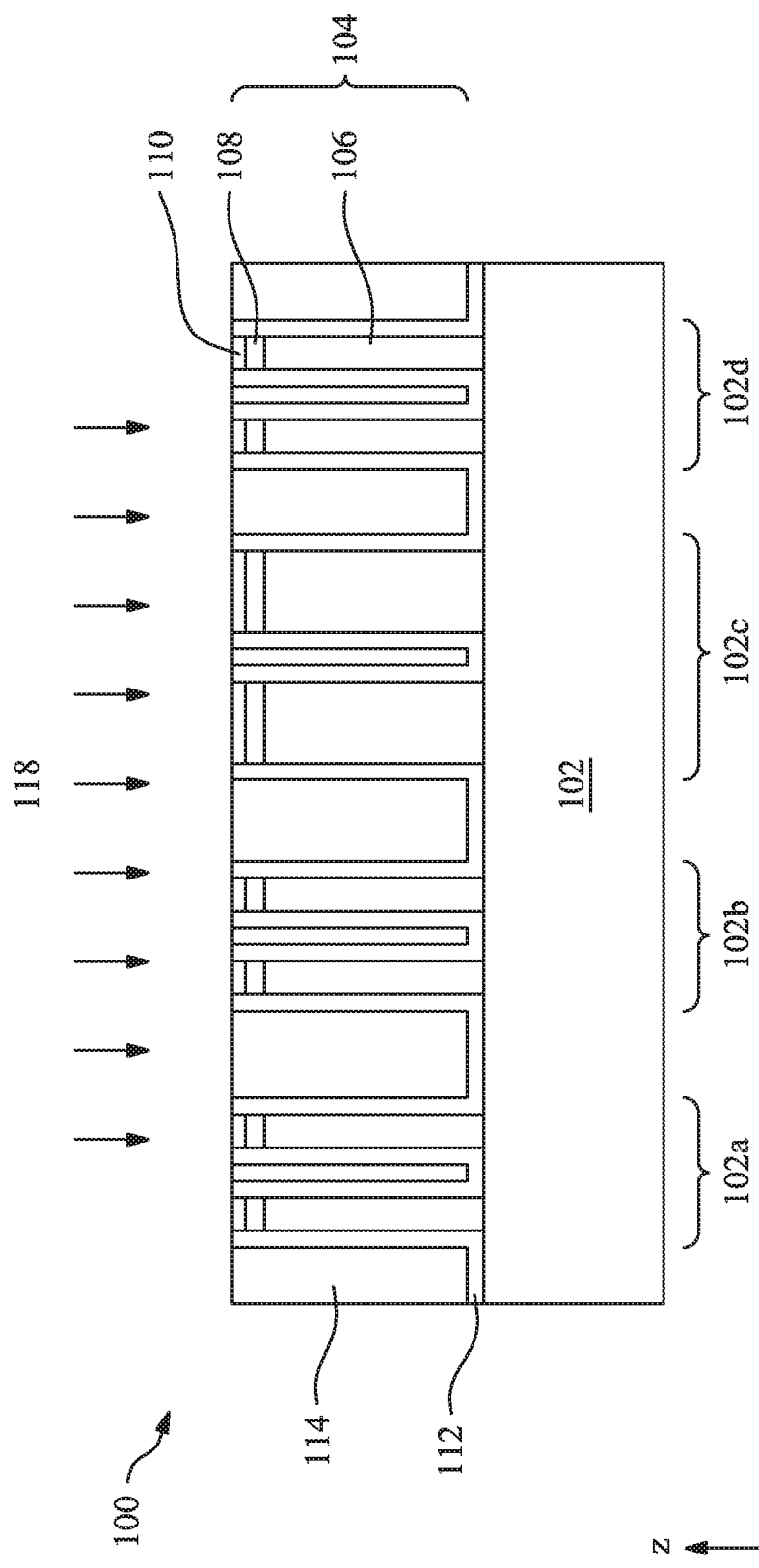

Referring to FIGS. 2 and 8 collectively, the first etching 118 (operation 26) has no etch selectivity or low etch selectivity with respect to the materials of the ILD layer 114, the ESL 112, and the second HM layer 110. In another word, the first etching 118 etches (or removes) the ILD layer 114, the ESL 112, and the second HM layer 110 at about the same rate. As a result, the top surface of the device 100 remains about flat during the first etching 118. In the present embodiment, the duration of the first etching 118 is controlled by a timer, which may be set based upon the thickness of the second HM layer 110 and the ESL 112 and the etching rate of the same such that the first etching 118 stops right before the first HM layer 108 is exposed. As illustrated in FIG. 8, a thin layer of the second HM layer 110 remains on the first HM layer 108 in an embodiment. In another embodiment, the first etching 118 completely removes the second HM layer 110 and may also slightly etch the first HM layer 108. Comparing the device 100 in FIGS. 7 and 8, even though the gate stacks 104 have different heights in different regions 102a-d before the first etching 118 is performed (FIG. 7), they now have near uniform heights after the first etching 118 is completed (FIG. 8).

Figure 9:
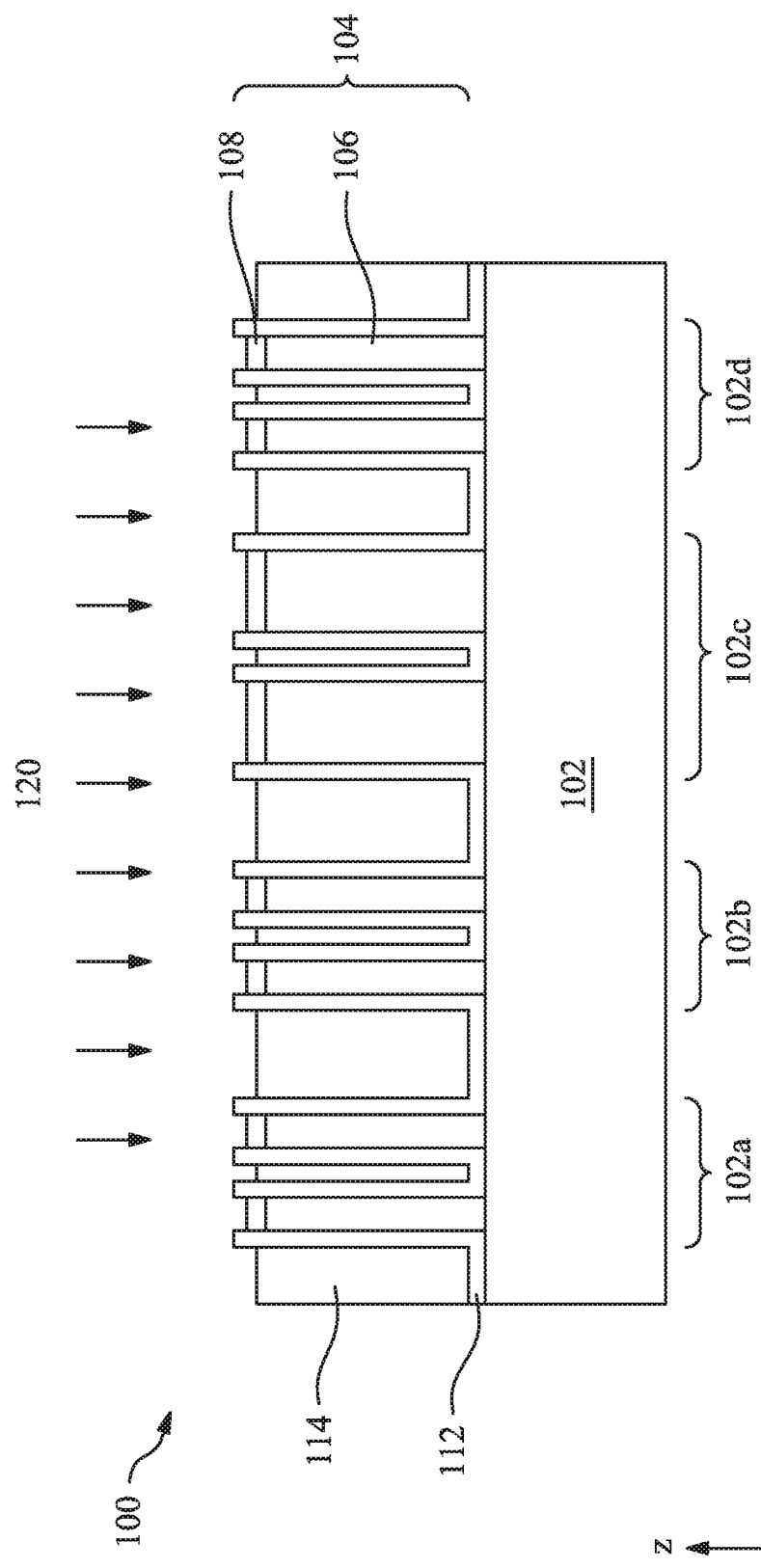

Referring to FIGS. 2 and 9 collectively, after the first etching 118 is completed, the device 100 undergoes the second etching 120 (operation 28). The second etching 120 uses a different etchant than that of the first etching 118. The second etching 120 is highly selective to the ILD layer 114 and the second HM layer 110. In another word, the second etching 120 removes the ILD layer 114 and the second HM layer 110 at a much higher rate than it removes the ESL 112 and the first HM layer 108. As a result, the second HM layer 110 is completely removed, the ILD layer 114 is partially removed, and the ESL 112 and the first HM layer 108 remain substantially unchanged (although some small amount of the ESL 112 and the first HM layer 108 may also be removed). In an embodiment, the duration of the second etching 120 is controlled by end-point detection. The end-point detection detects an element, such as nitrogen, that is included in the first HM layer 108 but not in the second HM layer 110 and the ILD layer 114. When the second etching 120 is completed, the first HM layer 108 and portions of the ESL 112 are exposed, as shown in FIG. 9. FIG. 9 shows that the top surface of the device 100 is uneven, with the ESL 112 and the first HM layer 108 being higher than the ILD 114. FIG. 9 further shows that the ESL 112 is higher than the first HM layer 108 in this embodiment. In various embodiments, the first HM layer 108 may be higher or lower than the ESL 112 or they may be at about same level, depending on the etch selectivity of the two layers in the second etching 120.

In an embodiment, both the first etching 118 and the second etching 120 are dry etching processes. The dry etching processes may implement an oxygen-containing gas, a fluorine-containing gas (e.g., $CF_4$, $SF_6$, $CH_2F_2$, $CHF_3$, and/or $C_2F_6$), a chlorine-containing gas (e.g., $Cl_2$, $CHCl_3$, $CCl_4$, and/or $BCl_3$), a bromine-containing gas (e.g., HBr and/or $CHBR_3$), an iodine-containing gas, other suitable gases and/or plasmas, and/or combinations thereof. In a further embodiment, both the first etching 118 and the second etching 120 are performed in the same dry etching process chamber. For example, the process chamber is supplied with a first etching gas (or gas mixture) that has no etch selectivity or low etch selectivity with respect to the materials of the ILD layer 114, the ESL 112, and the second HM layer 108. The first etching 118 is performed with the first etching gas for the duration discussed above. Then, the first etching gas is switched to a second etching gas (or gas mixture) that is highly selective to the materials of the ILD layer 114 and the second HM layer 108. The second etching 120 is performed with the second etching gas for the duration discussed above.

In an embodiment, the method 10 (FIG. 1) may perform an annealing process to enhance the quality of the ILD layer 114 subsequent to operation 20.

Figure 10:
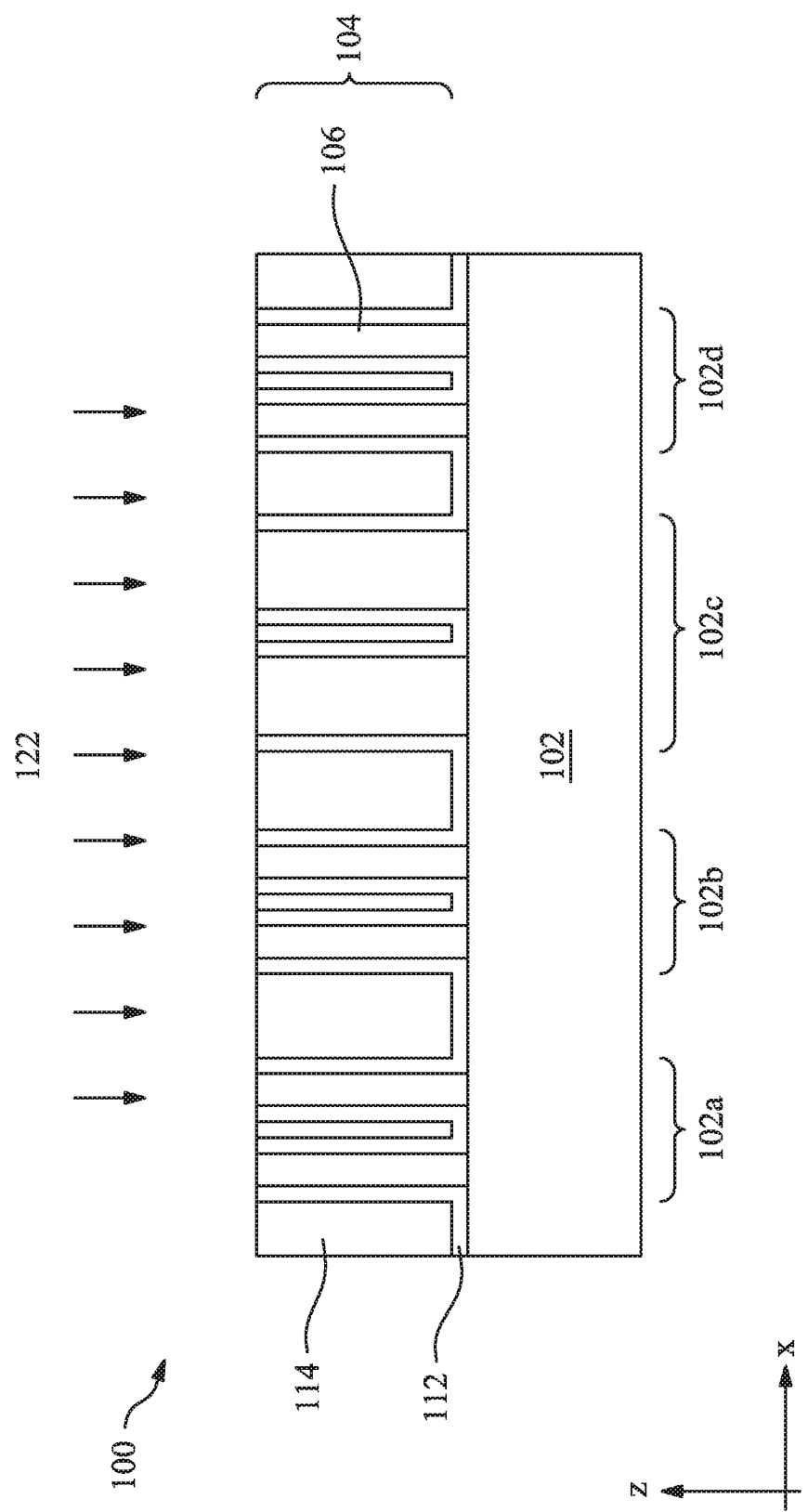

At operation 22, the method 10 (FIG. 1) performs a second CMP process 122 to at least partially remove the first HM layer 108. Referring to FIG. 10, in the present embodiment, the CMP process 122 completely removes the first HM layer 108, thereby exposing the electrode layer 106. The CMP process 122 also partially removes the ESL 112, thereby planarizing a top surface of the device 100. In an embodiment, the CMP process 122 applies CMP slurry that is selective to the materials of the ESL 112 and the first HM layer 108. In another word, the ESL 112 and the first HM layer 108 are removed at a higher rate than the ILD layer 114 during the buffing or polishing operations of the CMP process 122. In an embodiment, a cleaning process may be subsequently performed to remove any CMP residue. For example, the cleaning process may use deionized water (DIW).

Referring to FIG. 10, after operations 18, 20, and 22, the device 100 is provided with a planar top surface, and the electrode layer 106 is provided with a near uniform height without over-etching and without any residue from the HM layers 108/110. This lays a good foundation for subsequent gate replacement processes.

Figure 3:
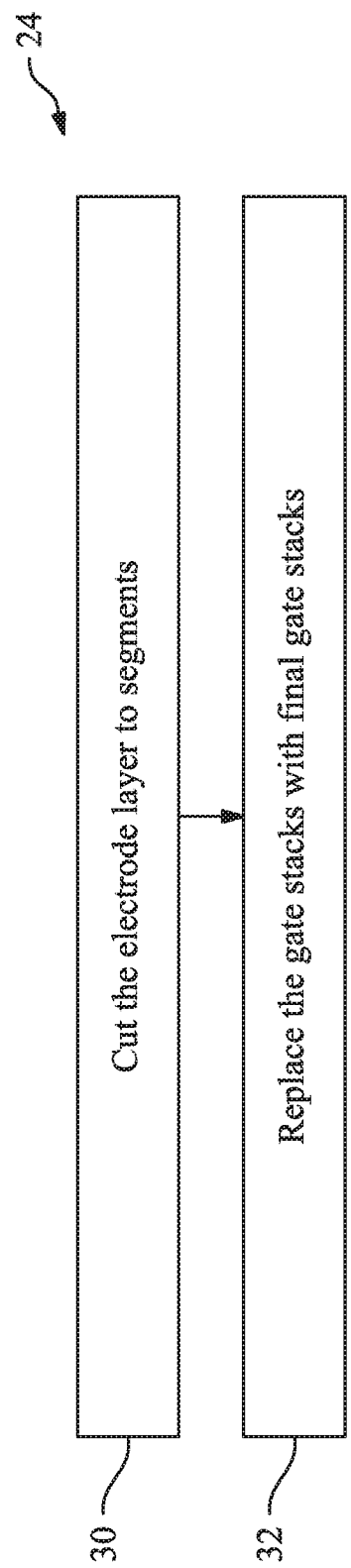

At operation 24, the method 10 (FIG. 1) performs further processes to fabricate a final IC device. In the present embodiment, operation 24 includes one or more steps that replace the electrode layer 106 with final gate stacks. One embodiment of operation 24 is shown in FIG. 3 that includes operation 30 followed by operation 32. At operation 30, the method 10 cuts at least some of the electrode layer 106 into multiple electrode segments. This is referred to as a "cut poly" step. At operation 32, the method 10 replaces the electrodes and electrode segments with final gate stacks. Operations 30 and 32 are briefly discussed below in conjunction with FIGS. 11-14.

Figure 11:
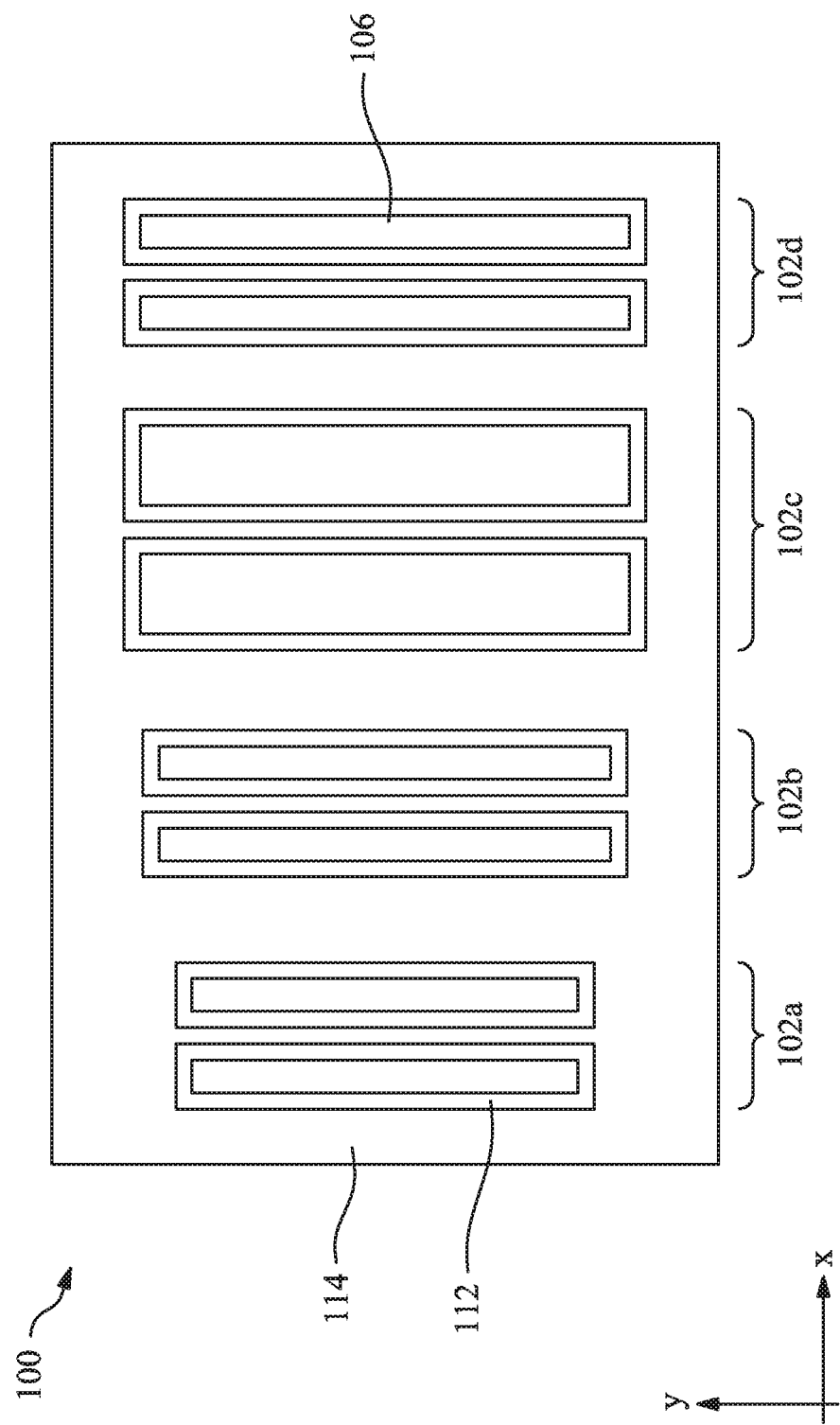
FIGS. 11 and 12 illustrate top views of forming a target semiconductor device according to the method of FIG. 1, in accordance with an embodiment.
Figure 12:
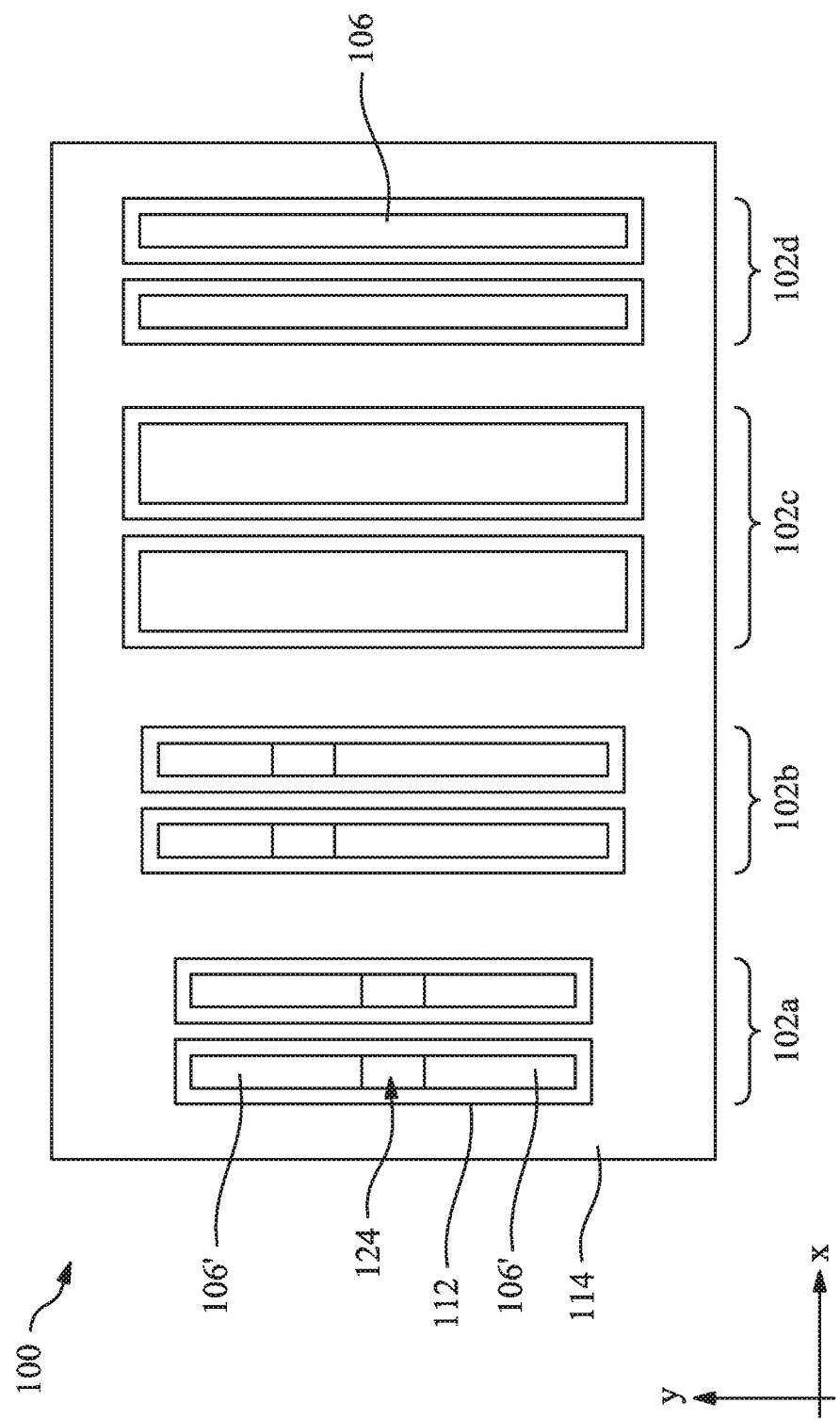
Figure 13:
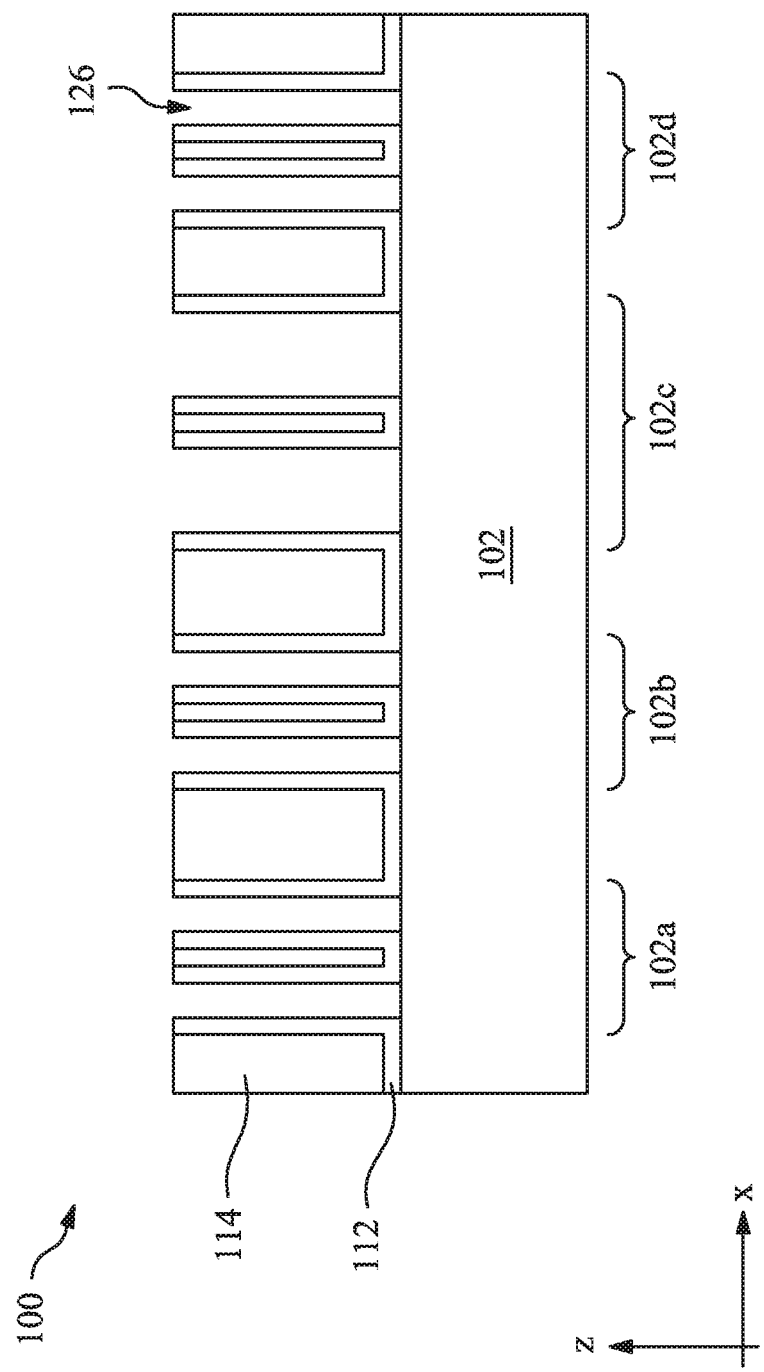

FIG. 11 shows a top view (in the "x-y" plane) of the device 100 post operation 22. Referring to FIG. 11, the electrode layer 106 includes a plurality of elongated shapes (electrodes 106) that are oriented widthwise in the "x" direction and lengthwise in the "y" direction. Each of the electrodes 106 is surrounded by the ESL 112 on its sidewall surfaces. The "cut poly" step of operation 30 may include photolithography and etching processes. For example, the photolithography process forms a masking element (e.g., a patterned resist) that covers portions of the electrodes 106 and exposes the remaining portions of the same. The etching process etches the exposed portions of the electrodes 106 through the masking element, thereby cutting them into segments. FIG. 12 illustrates a result of the "cut poly" step. Referring to FIG. 12, each of the electrodes 106 in the regions 102a and 102b is cut into two segments 106'. The two segments 106' are separated by a gap 124. In an embodiment, the gaps 124 are subsequently filled with an isolation material to electrically isolate the segments. In embodiments, the electrodes 106 in any regions 102a-d may be cut into two or more segments. In advanced process nodes such as 16 nm or smaller, the "cut poly" step helps achieve higher device density by forming regular patterns using one photomask and cutting the regular patterns using another photomask. The electrodes 106 prepared according to embodiments of the present disclosure are particularly suitable for the "cut poly" step because they have near uniform heights and are free of oxide or nitride residue at their top surface (FIG. 10). Electrodes prepared according to traditional methods may have oxide or nitride residues at their top surface. Consequently, the electrodes may not be completely cut and isolated during the "cut poly" step.

Figure 14:
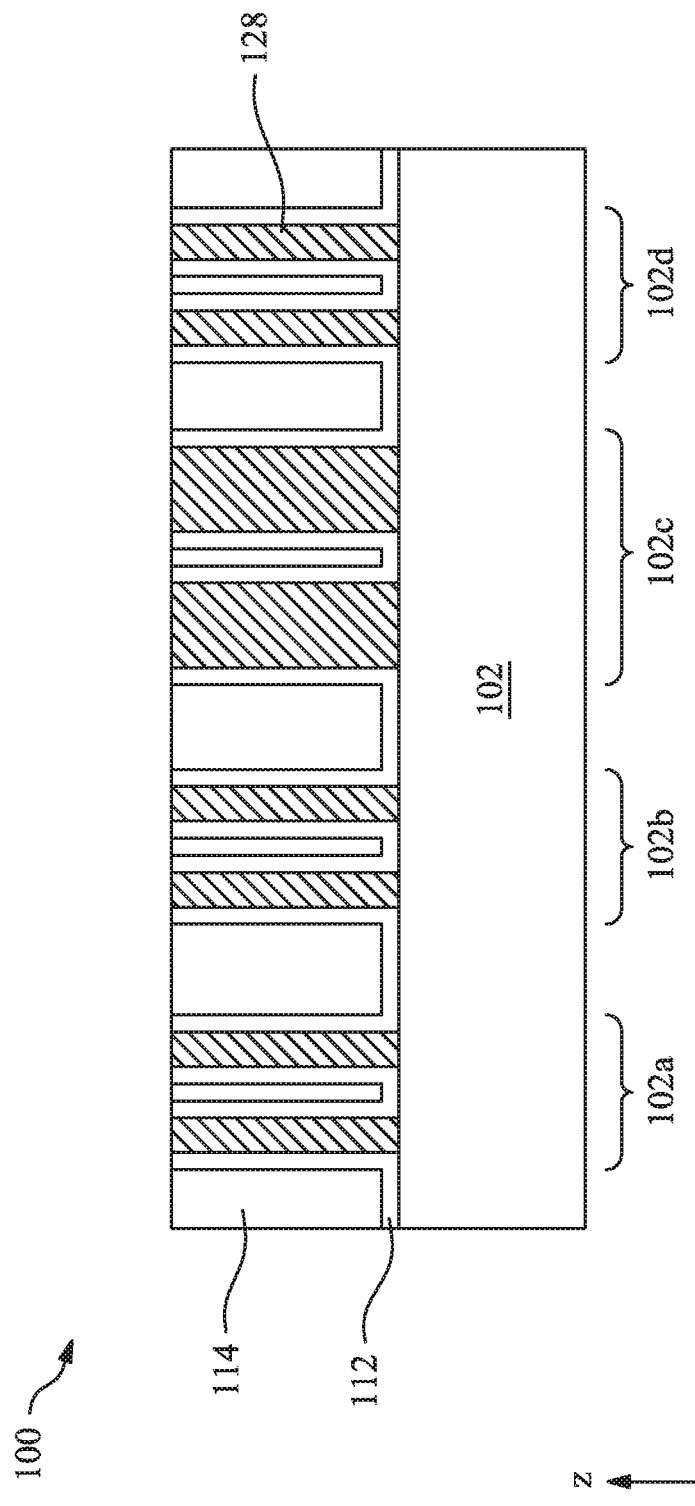

At operation 32, the electrodes 106 and the electrode segments 106' (collectively "the electrodes 106") are replaced with final gate stacks. This may involve one or more etching and deposition processes. For example, the one or more etching processes remove the electrodes 106 to form openings 126 (FIG. 13), and the one or more deposition processes form final gate stacks 128 in the openings 126 (FIG. 14). In one example, the final gate stacks 128 include an interfacial layer, a gate dielectric layer, a work function metal layer, and a metal fill layer. The interfacial layer may include a dielectric material such as silicon oxide or silicon oxynitride, and may be formed by chemical oxidation, thermal oxidation, ALD, CVD, and/or other suitable dielectric. The gate dielectric layer may include a high-k dielectric material such as hafnium oxide, zirconium oxide, lanthanum oxide, titanium oxide, yttrium oxide, strontium titanate, other suitable metal-oxides, or combinations thereof. The gate dielectric layer may be formed by ALD and/or other suitable methods. The work function metal layer may be a p-type or an n-type work function layer. The p-type work function layer comprises a metal with a sufficiently large effective work function, such as titanium nitride, tantalum nitride, ruthenium, molybdenum, tungsten, platinum, or combinations thereof. The n-type work function layer comprises a metal with sufficiently low effective work function such as titanium, aluminum, tantalum carbide, tantalum carbide nitride, tantalum silicon nitride, or combinations thereof. The work function metal layer may include a plurality of layers and may be deposited by CVD, PVD, and/or other suitable process. The metal fill layer may include aluminum, tungsten, cobalt, copper, and/or other suitable materials. The metal fill layer may be formed by CVD, PVD, plating, and/or other suitable processes.

Operation 24 may include further steps, such as forming source/drain/gate contacts and forming metal interconnects, to complete the fabrication of the device 100.

Although not intended to be limiting, one or more embodiments of the present disclosure provide many benefits to a semiconductor device and the formation thereof. An embodiment of the present disclosure uses a process including a CMP process, a dry etching process, and another CMP process to completely remove hard mask layers atop a poly layer prior to gate replacement. Such process results in near uniform height in the poly layer without over-etching of the poly layer. This provides a good foundation for subsequent gate replacement. Embodiments of the present disclosure can be easily integrated with existing manufacturing processes in the advanced process nodes.

In one exemplary aspect, the present disclosure is directed to a method of forming a semiconductor device. The method includes providing a precursor having a substrate and gate stacks over the substrate. Each of the gate stacks includes an electrode layer, a first hard mask (HM) layer over the electrode layer, and a second HM layer over the first HM layer. The method further includes depositing a dielectric layer over the substrate and the gate stacks and filling spaces between the gate stacks. The method further includes performing a first chemical mechanical planarization (CMP) process to partially remove the dielectric layer; and performing an etching process to remove the second HM layer and to partially remove the dielectric layer, thereby exposing the first HM layer. The method further includes performing a second CMP process to at least partially remove the first HM layer.

In another exemplary aspect, the present disclosure is directed to a method of forming a semiconductor device. The method includes providing a precursor having a substrate and gate stacks disposed over the substrate, wherein each of the gate stacks includes an electrode layer, a first hard mask (HM) layer over the electrode layer, and a second HM layer over the first HM layer. The method further includes forming an etch stop layer (ESL) over the substrate and covering top and sidewalls of the gate stacks; and depositing an inter-layer dielectric (ILD) layer over the ESL and filling spaces between the gate stacks. The method further includes performing a first chemical mechanical planarization (CMP) process to partially remove the ILD layer; performing a dry etching process to partially remove the ESL, the ILD layer, and the second HM layer, thereby exposing the first HM layer; and performing a second CMP process to at least partially remove the first HM layer.

In another exemplary aspect, the present disclosure is directed to a method of forming a semiconductor device. The method includes providing a precursor having a substrate and gate stacks disposed over the substrate. Each of the gate stacks includes a poly layer, a nitride hard mask (HM) layer over the poly layer, and an oxide HM layer over the nitride HM layer. The method further includes forming an etch stop layer (ESL) over top and sidewalls of the gate stacks. The ESL comprises a nitride. The method further includes depositing an inter-layer dielectric (ILD) layer covering the ESL and the gate stacks and filling spaces between the gate stacks. The ILD layer comprises an oxide. The method further includes performing a first chemical mechanical planarization (CMP) process to partially remove the ILD layer until the ESL is exposed; and performing a first etching process to partially remove at least the ESL, the ILD layer, and the oxide HM layer. After the performing of the first etching process, the method further includes performing a second etching process selectively tuned to etch the ILD layer and the oxide HM layer while the nitride HM layer remains substantially unchanged, thereby exposing the nitride HM layer. The method further includes performing a second CMP process to selectively remove the nitride HM layer while the ILD layer remains substantially unchanged.

The foregoing outlines features of several embodiments so that those of ordinary skill in the art may better understand the aspects of the present disclosure. Those of ordinary skill in the art should appreciate that they may readily use the present disclosure as a basis for designing or modifying other processes and structures for carrying out the same purposes and/or achieving the same advantages of the embodiments introduced herein. Those of ordinary skill in the art should also realize that such equivalent constructions do not depart from the spirit and scope of the present disclosure, and that they may make various changes, substitutions, and alterations herein without departing from the spirit and scope of the present disclosure.

What is claimed is:
1. A method comprising:
providing a precursor including:
  a substrate;
  a first gate stack and a second gate stack, the first gate stack being a different size than the second gate stack, wherein each of the first and second gate stacks includes an electrode and a first layer disposed over the electrode; and
forming a first material layer over the first and second gate stacks;
forming a dielectric layer on the first material layer disposed over the first and second gate stacks;
performing a first planarization process to remove a first portion of the dielectric layer from over the first and second gate stacks, wherein the first planarization process exposes the first material layer over the first gate stack without exposing first material layer over the second gate stack, wherein the first planarization process includes applying a slurry to remove the first portion of the dielectric layer from over the first and second gate stacks;
removing a second portion of the dielectric layer and a first portion of the first material layer from over the first and second gate stacks to expose the first layer in the first and second gate stacks, wherein the removing of the second portion of the dielectric layer and the first portion of the first material layer from over the first and second gate stacks includes applying a first etchant that has a different material composition than the slurry;
removing the first layer from the first and second gate stacks; and
performing a second planarization process on the first and second gate stacks, wherein the second planarization process exposes the electrode of the first and second gate stacks.

2. The method of claim 1, wherein the first and second gate stacks extend to the same height over the substrate prior to forming the first material layer over the first and second gate stacks.

3. The method of claim 1, wherein the first and second gate stacks extend to different heights over the substrate prior to forming the first material layer over the first and second gate stacks.

4. The method of claim 1, wherein the removing of the second portion of the dielectric layer and the first portion of the first material layer from over the first and second gate stacks to expose the first layer in the first and second gate stacks includes performing a first etching process with the first etchant; and
wherein the removing of the first layer from the first and second gate stacks includes performing a second etching process with a second etchant that is different than the first etchant.

5. The method of claim 1, further comprising:
removing the electrode from each of the first and second gate stacks to form a trench;
forming a high-k dielectric layer in the trench of the first and second gate stacks; and
forming a metal gate electrode on the high-k dielectric layer in the trench of the first and second gate stacks.

6. The method of claim 1, further comprising:
removing a portion of the exposed electrode of the first and second gate stacks to form a gap separating a first electrode segment and a second electrode segment in each of the first and second gate stacks;
forming an isolation material in the gap;

removing the first electrode segment and the second electrode segment in each of the first and second gate stacks to form first and second trenches in each of the first and second gate stacks;

forming a gate dielectric in the first and second trenches in each of the first and second gate stacks; and forming a gate electrode on the gate dielectric in the first and second trenches in each of the first and second gate stacks.

7. The method of claim 1, wherein the electrode includes a polysilicon material, and wherein the first layer is a hard mask layer formed of a nitride material.

8. The method of claim 1, further comprising:

removing a portion of the exposed electrode of the first and second gate stacks to form a gap separating a first electrode segment and a second electrode segment in each of the first and second gate stacks; and forming an isolation material in the gap.

9. A method comprising:

forming a first gate stack and a second gate stack over a substrate, wherein the first and second gate stacks each includes a gate electrode layer and a first hard mask layer over the gate electrode layer, wherein the second gate stack extends to a different height over the substrate than the first gate stack;

forming a dielectric layer over the first and second gate stacks;

performing a first planarization process to remove a first portion of the dielectric layer over the first and second gate stacks, wherein a second portion of the of the dielectric layer is disposed directly over the first gate while no portions of the dielectric layer are disposed directly over the second gate stack after the performing of the first planarization process, wherein the first planarization process includes applying a slurry to remove the first portion of the dielectric layer from over the first and second gate stacks;

performing an etching process to expose the first hard mask layer in the first and second gate stacks, wherein the etching process includes applying a first etchant to expose the first hard mask layer in the first and second gate stacks, the first etchant that having a different material composition than the slurry; and performing a second planarization process to remove the first hard mask layer in at least the second gate stack.

10. The method of claim 9, wherein the etching process includes:

a first dry etching process with the first etchant; and a second dry etching process with a second etchant that is different form the first etchant.

11. The method of claim 9, further comprising forming an etch stop layer over the first and second gate stacks prior to forming the dielectric layer over the first and second gate stacks, and wherein the etch stop layer disposed over the second gate stack is exposed after performing the first planarization process to remove the first portion of the dielectric layer over the first and second gate stacks.

12. The method of claim 9, wherein the first and second gate stacks each further includes a second hard mask layer over the first hard mask layer, and wherein performing the etching process to expose the first hard mask layer in the first and second gate stacks includes:

performing a first etching process that exposes the second hard mask layer in the first and second gate stacks, wherein the first hard mask layer is covered by the second hard mask layer after performing the first etching process; and performing a second etching process that exposes the first hard mask layer by removing the second hard mask layer in the first and second gate stacks.

13. The method of claim 12, wherein the first hard mask layer if formed of a different material the second hard mask layer.

14. The method claim 9, wherein the electrode layer in at least the second gate stack is exposed after performing the second planarization process to remove the first hard mask layer in at least the second gate stack.

15. The method of claim 14, further comprising removing the electrode layer in a at least the second gate stack.

16. A method comprising:

forming a first gate stack and a second gate stack over a substrate, wherein the first and second gate stacks each includes a gate electrode layer, wherein the second gate stack extends to a different height over the substrate than the first gate stack, wherein the first and second gate stacks each further includes a first hard mask layer disposed over the gate electrode layer and a second hard mask layer disposed over the first hard mask layer;

forming an etch stop layer (ESL) on the first and second gate stacks;

forming an inter-layer dielectric (ILD) layer on the ESL;

removing a first portion of the ILD layer to expose the ESL over the first gate stack while a second portion of the ILD layer covers the ESL disposed over the second gate stack;

removing the second portion of the ILD layer and the ESL layer over the first and second gate stacks to expose a portion of the first and second gate stacks, wherein the exposed portion of the first and second gate stacks includes exposing the second hard mask layer in the first and second gate stacks; and removing the exposed portion of the first and second gate stacks to expose the gate electrode layer in the first and second gate stacks.

17. The method of claim 16, wherein removing the exposed portion of the first and second gate stacks to expose the gate electrode layer in the first and second gate stacks includes:

performing a first removal process to remove the exposed second hard mask layer in the first and second gate stacks to expose the first hard mask layer; and performing a second removal process to remove the exposed first hard mask layer in the first and second gate stacks to thereby exposed the gate electrode layer in the first and second gate stacks, the second removal process being different from the first removal process.

18. The method of claim 17, wherein performing the first removal process to remove the exposed second hard mask layer in the first and second gate stacks to expose the first hard mask layer in the first and second gate stacks includes performing a first etching process with a first etchant and a second etching process with a second etchant that is different than the first etchant.

19. The method of claim 17, wherein performing the second removal process to remove the exposed first hard mask layer in the first and second gate stacks to thereby exposed the gate electrode layer in the first and second gate stacks includes performing a chemical mechanical planarization (CMP) process.

20. The method of claim 16, further comprising:
removing the exposed gate electrode layer in the first gate stack to form a gap; and
forming an isolation material in the gap.

\* \* \* \* \*